(12) United States Patent
Mallik et al.

(10) Patent No.: US 7,794,236 B2
(45) Date of Patent: Sep. 14, 2010

(54) LAND GRID ARRAY (LGA) SOCKET FOR VARIOUS PACKAGE SIZES

(75) Inventors: Debendra Mallik, Chandler, AZ (US); Brent Stone, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/335,353

(22) Filed: Dec. 15, 2008

(65) Prior Publication Data

US 2010/0151706 A1    Jun. 17, 2010

(51) Int. Cl.
*H01R 12/00* (2006.01)
(52) U.S. Cl. .................................. 439/71; 439/342
(58) Field of Classification Search .................. 439/66, 439/70, 71, 74, 218, 330, 342, 680
See application file for complete search history.

(56) References Cited

U.S. PATENT DOCUMENTS

| | | | |
|---|---|---|---|
| 6,368,137 B1 * | 4/2002 | Orwoll | 439/331 |
| 6,541,991 B1 * | 4/2003 | Hornchek et al. | 324/755 |
| 7,207,808 B2 * | 4/2007 | Ma | 439/71 |
| 7,435,103 B2 * | 10/2008 | Ma | 439/71 |
| 7,563,107 B2 * | 7/2009 | Liao et al. | 439/71 |

* cited by examiner

*Primary Examiner*—Thanh-Tam T Le
(74) *Attorney, Agent, or Firm*—Blakely, Sokoloff, Taylor & Zafman LLP

(57) ABSTRACT

An LGA socket for receiving substrate packages of various sizes and a method of fabricating the socket. In an embodiment, the socket has a planar surface for seating a substrate package. Socket contacts are disposed on the planar surface in a layout common to the layout of interconnects formed on the bottom of substrate packages the socket is designed to receive. A plurality of socket locating features is formed on the socket body to prevent lateral displacement of a reference substrate package. A corresponding number of package locating features are formed on the substrate body of packages larger than the reference substrate package. Each of the socket locating features meshes with the corresponding package locating feature of the larger package.

17 Claims, 5 Drawing Sheets

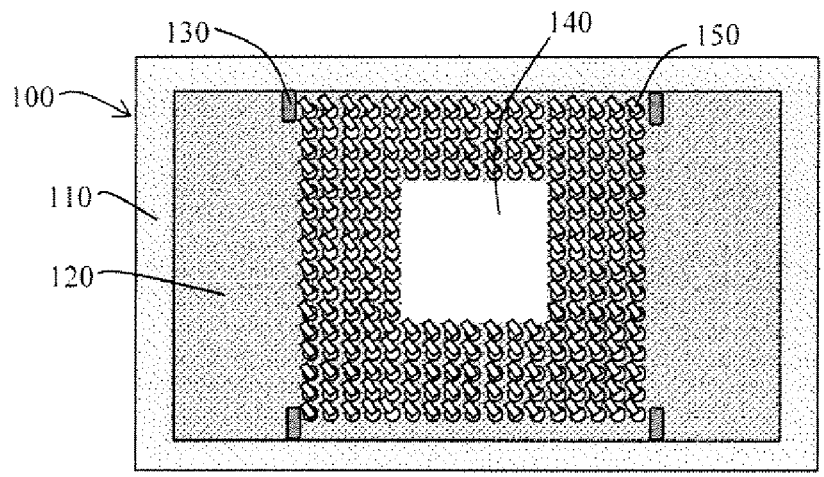
FIG. 1
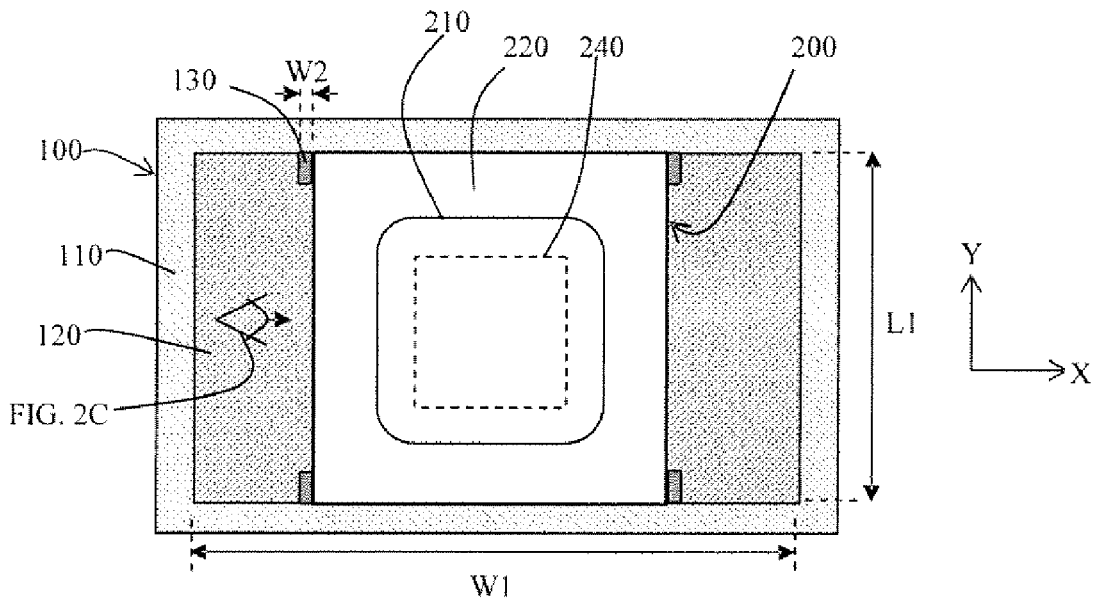
FIG. 2A
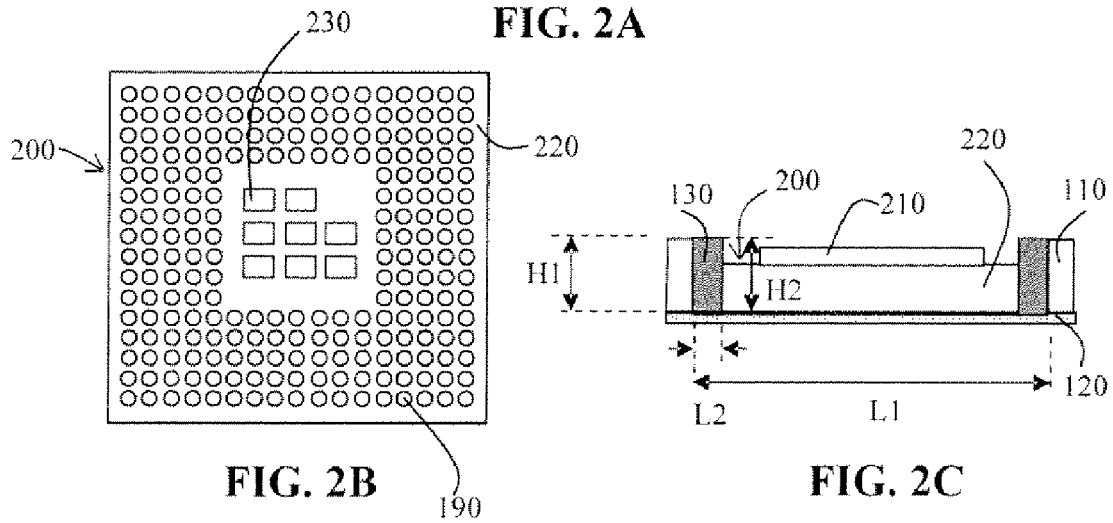
FIG. 2B     FIG. 2C

_US 7,794,236 B2_

LAND GRID ARRAY (LGA) SOCKET FOR VARIOUS PACKAGE SIZES

BACKGROUND OF INVENTION

1. Field

The present invention relates to an Land Grid Array (LGA) socket, in particular an LGA socket for receiving LGA packages of various sizes.

2. Discussion of Related Art

An LGA substrate package requires a socket to form connection with motherboard. Unlike Ball Grid Array (BGA) packages, LGA packages do not have solder balls at the bottom of the package to be soldered directly to motherboard to form interconnection.

An LGA socket is conventionally designed to house an LGA substrate package of one size. As advanced features such as multiple dies, larger die size and connectors on top side of package are introduced in semiconductor packages, a package with larger size is required. New sockets are required to be designed for new packages with larger size. Introduction of new sockets incur additional costs and requires management of a large inventory and variety of sockets.

BRIEF DESCRIPTION OF THE DRAWINGS

FIG. 1 illustrates the top view of a socket according to a first embodiment of the invention;

FIG. 2A illustrates the top view of an embodiment of a smallest-sized substrate package placed in a socket according to a first embodiment of the invention;

FIG. 2B illustrates the bottom view of an embodiment of a smallest-sized substrate package;

FIG. 2C illustrates the side view of an embodiment of a smallest-sized substrate package placed in a socket according to a first embodiment of the invention;

FIG. 4B illustrates the top view of an embodiment of a larger substrate package placed in a socket according to a second embodiment of the invention;

FIG. 4C illustrates the side view of an embodiment of a larger substrate package placed in a socket according to a second embodiment of the invention;

DETAILED DESCRIPTION OF ILLUSTRATED EMBODIMENTS

Figure 3A:
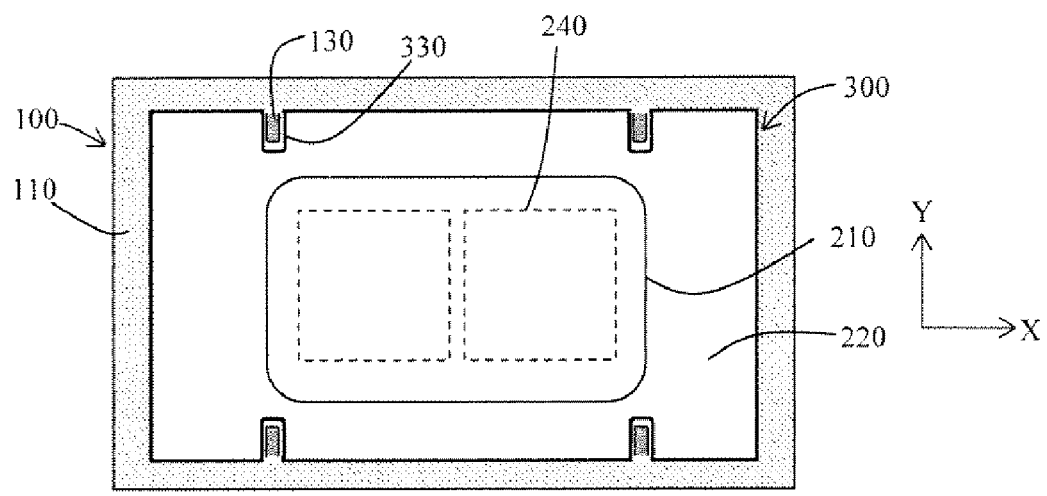
FIG. 3A illustrates the top view of an embodiment of a larger substrate package placed in a socket according to a first embodiment of the invention.

Embodiments of the present invention relate to an Land Grid Array (LGA) socket for receiving LGA substrate packages of various sizes. The socket provides a plurality of socket locating features which are commonly referenced by all substrate packages designed to fit in the socket. A smallest-sized package may be used as a reference package to determine the location of the socket locating features and socket contacts. Larger substrate packages include a plurality of corresponding package locating features for meshing with each of the socket locating features. The meshing between socket locating features and package locating features prevents lateral displacement of packages seated in the socket. Interconnects of all substrate packages have the same layout with socket contacts.

Reference throughout the specification to "one embodiment" or "an embodiment" means that a particular feature, structure or characteristic described in connection with the embodiment is included in at least one embodiment of the present invention. Thus, the appearance of said phrases in various places throughout the specification does not necessarily all refer to the same embodiment unless otherwise expressed. Furthermore, the particular features, structures or characteristics recited in the specification may be combined in any suitable manner in one or more embodiments.

FIG. 1 illustrates the top view of a socket according to a first embodiment of the invention. An embodiment of the invention may include socket body 100 having planar surface 120 for seating substrate packages of various sizes. In an embodiment, the edges of planar surface 120 may be bordered by sidewall 110. In an embodiment, the available surface area of planar surface 120 bordered by sidewall 110 corresponds to the size of the largest substrate package socket body 100 may receive. In another embodiment, socket body 100 has no sidewall 110 and the surface area of planar surface 120 is at least the size of the smallest-sized substrate package socket body 100 may receive. In an embodiment, socket body 100 may include cavity 140 defined by planar surface 120. Cavity 140 avoids electrical components on the bottom of a package seated on planar surface 120 from touching socket body 100. In an embodiment, socket contacts 150 may be disposed on planar surface 120. Socket contacts 150 connect a substrate package to a motherboard. In an embodiment, socket contacts 150 are disposed on planar surface 120 in a layout that match the electrical interconnects of a substrate package seated on planar surface 120.

FIG. 2A illustrates the top view of an embodiment of smallest-sized substrate package 200 placed in a socket according to a first embodiment of the invention. In an embodiment, smallest-sized substrate package 200 may be treated as a reference package. As a reference package, smallest-sized package 200 determines the locations of socket locating features 130 and socket contacts 150 on planar surface 120. In an embodiment, at least an edge of smallest-sized package 200 is referenced against a corresponding socket locating feature 130. As shown in FIG. 2A, smallest-sized package 200 placed on planar surface 120 falls within the perimeter defined by socket locating features 130 and sidewall 110. In an embodiment, the perimeter defined by socket locating features 130 and sidewall 110 falls at the center of planar surface 120. In another embodiment, the perimeter defined by socket locating features 130 and sidewall 110 may fall on the side of planar surface 120. In an embodiment, socket contacts 150 are disposed on planar surface 120 on the same layout with the electrical interconnects of smallest-sized package 200. In an embodiment, smallest-sized package 200 may include square substrate body 220. In another embodiment, smallest-sized package 200 may include rectangular substrate body 220. Substrate body 220 may include package lid 210 encapsulating chip 240 attached to substrate body 220. In an embodiment, chip 240 may be a semiconductor die. In another embodiment, chip 240 may be a cache memory or a combination of semiconductor die and cache memory.

FIG. 2B illustrates the bottom view of an embodiment of smallest-sized substrate package 200. In an embodiment, capacitors 230 are formed on the bottom side of substrate body 220. Package contact pads 190 are also formed on the bottom side of substrate body 220 as electrical interconnects. Package contact pads 190 have common layout with socket contacts 150 on socket body 100. Common layout between package contact pads 190 and socket contacts 150 will provide connection between smallest-sized package 200 and socket body 100. When smallest-sized package 200 is seated on planar surface 120 of socket body 100, socket contacts 150 will contact with package contact pads 190, Capacitors 230 of smallest-sized package 200 will overlap with cavity 140 and are prevented from touching socket body 100.

Referring back to FIG. 2A, in an embodiment of the invention, socket body 100 may include a plurality of socket locating features 130 formed on planar surface 120. Socket locating features 130 perform various functions. Firstly, socket locating features 130 define and correspond to the size of smallest-sized package 200 socket body 100 may receive. Secondly, socket locating features 130 prevent lateral displacement of a substrate package seated on planar surface 120. In an embodiment where socket body 100 is bordered by sidewall 110, socket locating feature 130 prevents lateral displacement along X direction of a substrate package seated on planar surface 120. In an embodiment where socket body 100 has no sidewall 110, socket locating feature 130 prevents lateral displacement of a substrate package seated on planar surface 120 along X and Y directions. The size of the substrate package may range from smallest-sized package 200 to the largest-sized package socket body 100 is designed to receive. Thirdly, socket locating feature 130 maintains the relative position of substrate packages seated on planar surface 120 with socket contacts 150 so that package contact pads 190 maintain good contact with socket contacts 150.

As illustrated in FIG. 2A, an embodiment has four socket locating features 130 formed on planar surface 120 such that smallest-sized package 200 falls within the perimeter bound by socket locating features 130 and sidewall 110. It may be contemplated in another embodiment that less than four socket locating features 130 may the formed on planar surface 120 corresponding to side edges of smallest-sized package 200. For example, exactly two socket locating features 130 may be formed diagonally on planar surface 120. In an embodiment, socket locating features 130 and smallest-sized package 200 may maintain a relative position within a gap tolerance. In an embodiment, the gap tolerance is substantially less than the radius of package contact pads 190 such that socket contacts 150 can stay within package contact pads 190. In an embodiment, socket locating features 130 may be connected to sidewall 110 and planar surface 120. In another embodiment, socket locating features 130 may be connected to planar surface 120 but not connected to sidewall 110. In an embodiment, socket locating features 130 are designed to be robust enough to withstand translational force exerted by substrate body 200. Translational force may be introduced intentionally for example when mounting substrate package in the socket or unintentionally as a result of shock or vibration on an assembly of substrate package and socket. In an embodiment, socket locating features 130 are designed to withstand lateral force generated during product use.

FIG. 2C illustrates the side view of an embodiment of smallest-sized substrate package 200 placed in a socket according to a first embodiment of the invention. In an embodiment, socket locating features 130 are rectangular members. In an embodiment, length L2 of socket locating features 130 is sufficient to enable locating of smallest-sized substrate package 200 when being mounted on planar surface 120 and to possess sufficient strength to withstand lateral force during use. In an embodiment, length L2 is between 1 and 3 mm. In another embodiment, length L2 may be 2-6% of length L1 of planar surface 120 available for seating substrate package. In an embodiment, height H2 of socket locating features 130 is sufficient to enable locating and to retain smallest-sized substrate package 200 within the perimeter of socket locating features 130. In an embodiment, height H2 of socket locating features 130 is substantially the same with height H1 of sidewall 110. Referring back to FIG. 2A and according to an embodiment, width W2 of socket locating features 130 may be 5-10% of width W1 of planar surface 120 available for seating substrate package. In another embodiment, width W2 of socket locating features 130 is between 2.5 and 5 mm. In another embodiment, socket locating features 130 may be square members. It may be contemplated that socket locating features 130 may have other geometrical shapes and other dimensions. Socket locating features 130 in an embodiment of invention may not necessarily be identical in dimensions. In an embodiment, all socket locating features 130 of socket body are identical in shape and dimensions. In another embodiment, socket locating features 130 of socket body 100 may have different shape or dimensions.

In an embodiment, socket locating features 130 may be fabricated simultaneously with socket body 100. In an embodiment, socket locating features 130 and socket body 100 are simultaneously fabricated by way of injection molding method. Socket locating features 130 may be made from thermoplastic polymers such as liquid crystal polymer (LCP), polyphenylene sulfide (PPS) and polyimide (PI).

FIG. 3A illustrates the top view of an embodiment of larger substrate package 300 placed in a socket according to a first embodiment of the invention. Larger package 300 is larger in size than smallest-sized package 200. Larger package 300 may be between the size of smallest-sized package 200 and the size of the largest package socket body 100 may receive. In an embodiment, larger package 300 may have the size that correspond to the largest package socket body 100 may receive. In an embodiment, larger package 300 may be larger than smallest-sized package 200 in X direction only. In another embodiment, larger package 300 may be larger than smallest-sized package 200 in both X and Y directions. In an embodiment, package lid 210 of larger package 300 is larger than package lid 210 of smallest-sized package 200. Package lid 210 of larger package 300 encapsulates larger chip 240 attached to substrate body 220 of larger package 300. In an embodiment, larger chip 240 may include two or more semiconductor dies or larger semiconductor dies or a larger quantity of cache memory compared to the number or size of semiconductor dies or cache memory of smallest-sized package 200. Hence, in an embodiment, the size of substrate body 220 of larger package 300 is larger than substrate body 220 of smallest-sized package 220 in order to accommodate larger chip 240.

Still referring to FIG. 3A, in an embodiment, larger package 300 has at least two package locating features 330. Package locating features 330 of larger package 300 are formed on substrate body 220 such that package locating features 330 do not interfere with the useful real estate of larger package 300 and enable package size growth along X or Y or both X and Y directions. In an embodiment, larger package 300 has a number of package locating features 330 equivalent to the number of socket locating features 130. Each package locating feature 330 of larger package 300 meshes with a corresponding socket locating feature 130 of socket body 100. Package locating features 330 of larger package 300 mesh with socket locating features 130 such that lateral displacement of larger package 300 seated on planar surface 120 may be prevented. In an embodiment, the meshing between socket locating features 130 and package locating features 330 prevents lateral displacement of larger package 300 along X direction.

Figure 3B:
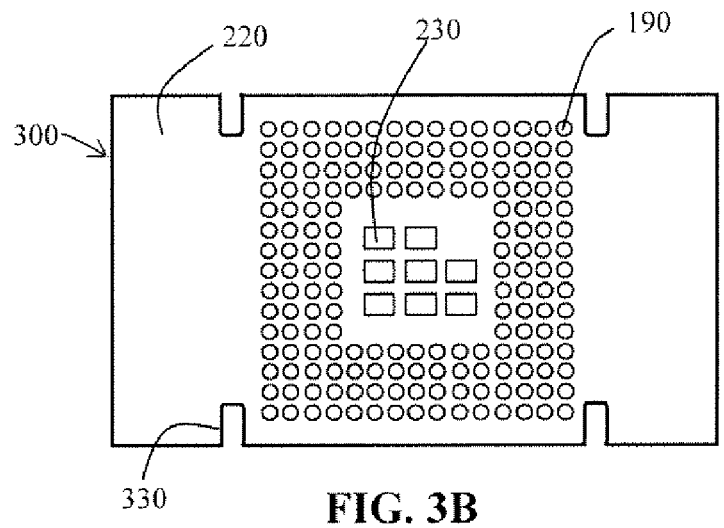
FIG. 3B illustrates the bottom view of an embodiment of a larger substrate package.

FIG. 3B illustrates the bottom view of an embodiment of larger substrate package 300. In an embodiment, the bottom side of larger package 300 may include package contact pads 190 formed on substrate body 220. The layout of package contact pads 190 has the same layout with socket contacts 150 disposed on socket body 10 and package contact pads 190 of smallest-sized package 200. Meshing between package locating features 330 and socket locating features 130 of socket body ensures package contact pads 190 of larger package 300 properly contact with socket contacts 150 disposed on socket body 100. In an embodiment, the bottom side of larger package 300 may include capacitors 230. When larger package 300 is seated on planar surface 120, capacitors 230 will rest in cavity 140 of socket body 100.

Still referring to FIG. 3B, package locating features 330 have a shape that enables package locating features 330 to mesh with socket locating features 130. In an embodiment, package locating features 330 may function as female couplings while socket locating features 130 may function as male couplings. In an embodiment of larger package 300, package locating feature 330 may be a notch formed on substrate body 220. In an embodiment, package locating feature 330 may be a rectangular notch formed adjacent to the edge of substrate body 220 with a portion of the rectangular notch unbounded. In another embodiment, package locating feature 330 may be a square notch. In another embodiment, package locating feature 330 may be a square notch formed adjacent to an edge of substrate body 220 with a portion of the square notch unbounded.

Figure 4A:
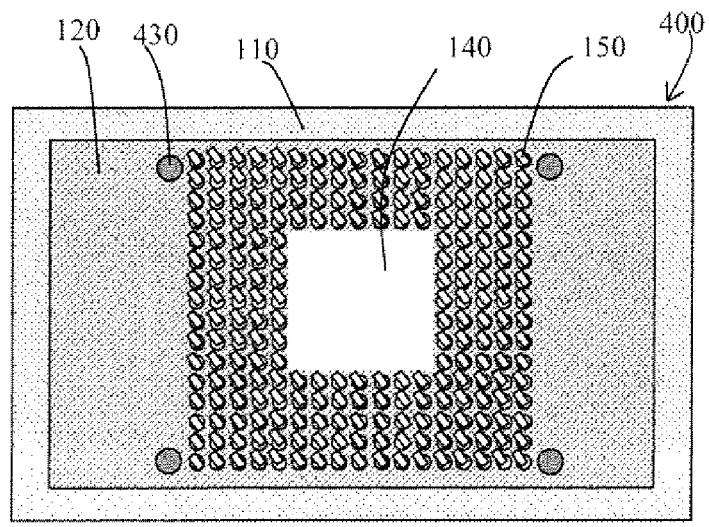
FIG. 4A illustrates the top view of a socket according to a second embodiment of the invention.

FIG. 4A illustrates the top view of a socket according to a second embodiment of the invention. In an embodiment, socket body 400 may include round pins as socket locating features 430 formed on planar surface 120. However, other embodiments do not preclude socket locating features 430 from having other shapes such as cylindrical shape with round top and cylindrical shape with flat top. In an embodiment, socket locating features 430 are not connected to sidewall 110. In another embodiment, socket locating features 430 may be connected to sidewall 110.

FIG. 4B illustrates the top view of an embodiment of larger substrate package 440 placed in a socket according to a second embodiment of the invention. An embodiment of larger package 440 may include package locating features 450 being round through holes formed on substrate body 220. Through hole package locating features 450 mesh with round socket locating features 430 of socket body 400. FIG. 4C illustrates the side view of an embodiment of larger substrate package 440 having round-shaped socket locating features 430 seated on planar surface 120 of socket body 400. In an embodiment, round socket locating features 430 has the same height with sidewall 110. In another embodiment, sidewall 110 is higher than round socket locating features 430.

Figure 5A:
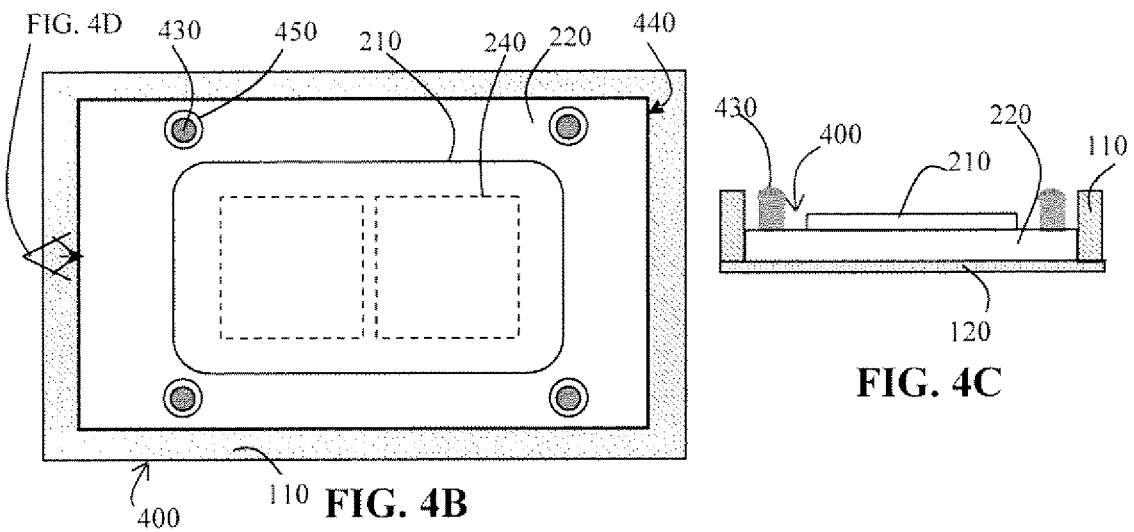
FIG. 5A illustrates the top view of a socket according to a third embodiment of the invention.
Figure 5A:
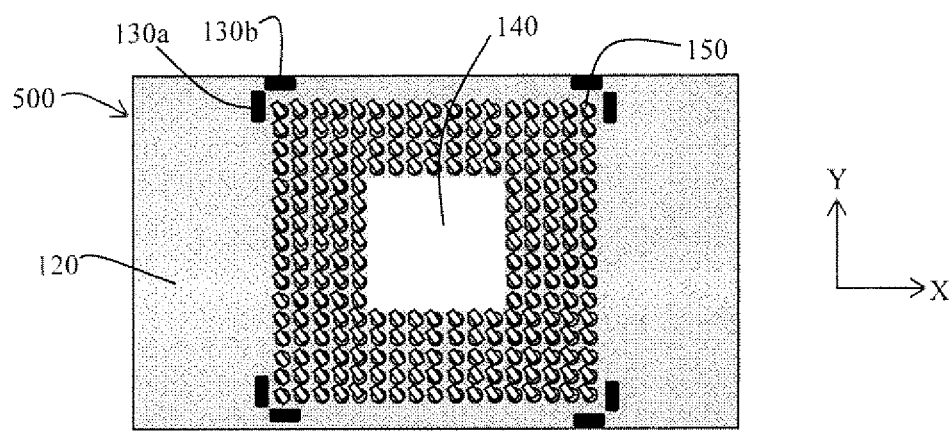
Figure 5B:
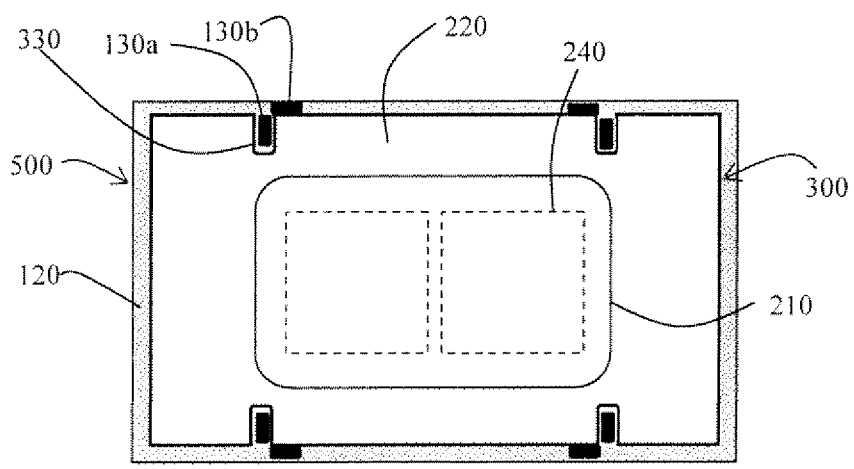
FIG. 5B illustrates the top view of an embodiment of larger substrate package placed in a socket according to a third embodiment of the invention.

FIG. 5A illustrates the top view of a socket according to a third embodiment of the invention. Socket locating features 130 may be modified to eliminate having sidewall 110 on socket body 500. In an embodiment, socket body 500 has planar surface 120. Planar surface 120 has no sidewall 110. The surface area of planar surface 120 in this embodiment is at least the size of the smallest-sized substrate package socket body 500 may receive. In an embodiments socket body 500 may include socket locating features 130a, 130b formed on planar surface 120. In an embodiment, socket locating features 130a, 130b may be disposed on planar surface 120 to form a perimeter that corresponds to the size of smallest-sized substrate package 200 socket body 500 may receive. In an embodiment, four pairs of socket locating features 130a, 130b may be formed on planar surface 120 at locations corresponding to four corners of smallest-sized substrate package 200 seated on planar surface 120. In an embodiment, socket locating features 130a, 130b may be connected to form an L-shaped member. In another embodiments socket locating feature 130a, 130b may be arranged perpendicularly to each other and correspond to a corner of smallest-sized package 200. When smallest-sized package 200 is placed in the socket according to a third embodiment of the invention, socket locating feature 130b will prevent smallest-sized package 200 from being displaced along Y direction while socket locating feature 130a will prevent lateral displacement along X direction. FIG. 5B illustrates an embodiment of larger package 300 placed on socket body 500 of a third embodiment of the invention. Socket locating feature 130b will prevent lateral displacement of larger package 300 along Y direction while socket locating feature 130a will prevent lateral displacement along X direction.

Figure 6A:
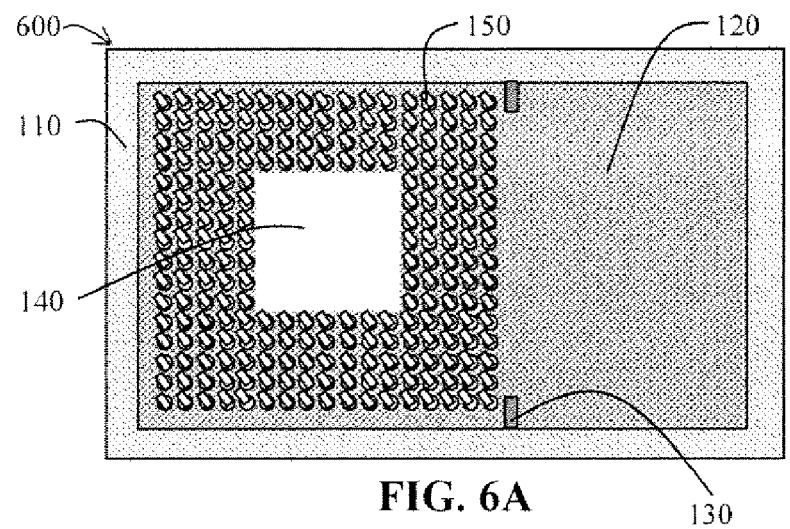
FIG. 6A illustrates the top view of a socket according to a fourth embodiment of the invention.
Figure 6B:
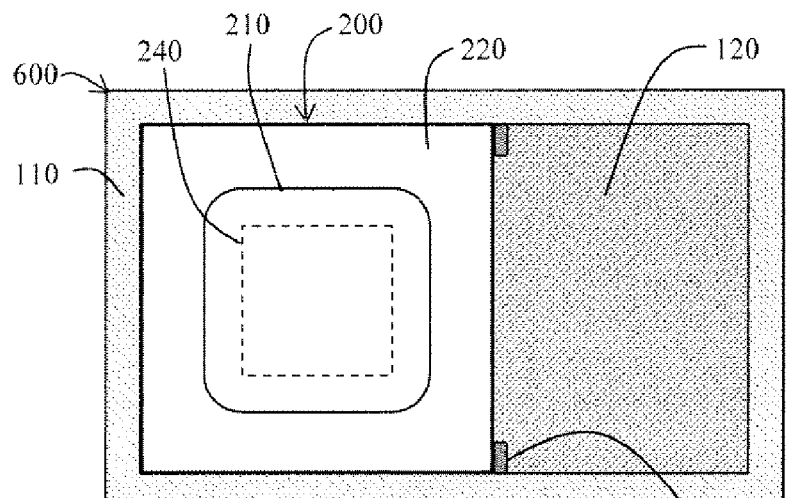
FIG. 6B illustrates the top view of an embodiment of a smallest-sized substrate package placed in a socket according to a fourth embodiment of the invention.
Figure 6C:
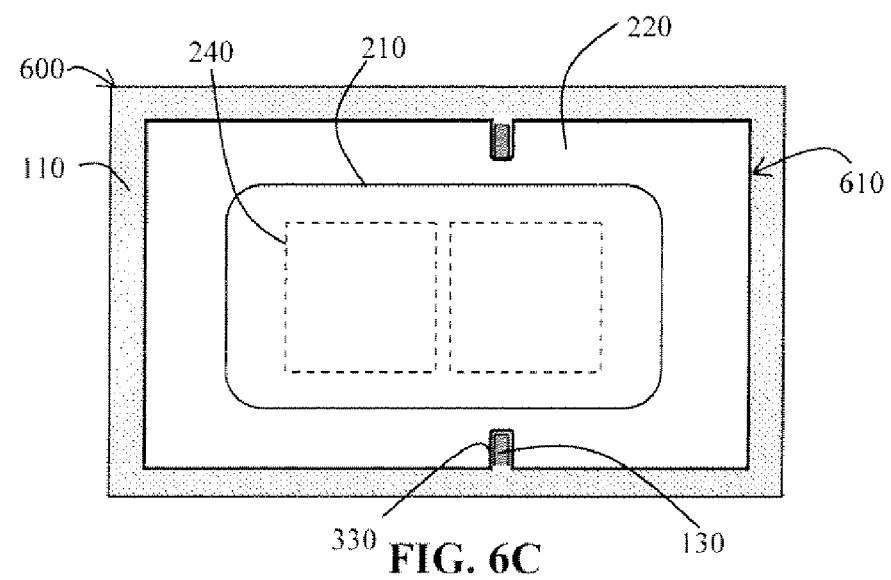
FIG. 6C illustrates the top view of an embodiment of a larger substrate package placed in a socket according to a fourth embodiment of the invention.

FIG. 6A illustrates the top view of a socket according to a fourth embodiment of the invention. In an embodiment, socket body 600 may include two socket locating features 130 to prevent lateral displacement of substrate packages seated on planar surface 120. In an embodiment, socket body 600 may include rectangular socket locating feature 130 and planar surface 120 bordered by sidewall 110. FIG. 6B illustrates the top view of an embodiment of smallest-sized substrate package 200 placed in a socket according to a fourth embodiment of the invention. In this embodiment, smallest-sized package 200 acts as a reference package. An edge of smallest-sized package 200 is referenced against socket locating feature 130 such that the perimeter bound by socket locating feature 130 and sidewall 110 falls on the side of planar surface 120, FIG. 6C illustrates the top view of an embodiment of larger substrate package 610 placed in a socket according to a fourth embodiment of the invention. In an embodiment, larger package 610 has a corresponding rectangular package locating feature 330 formed on substrate body 220. In an embodiment, rectangular package locating feature 330 may be a rectangular notch having a portion unbounded.

Figure 7A:
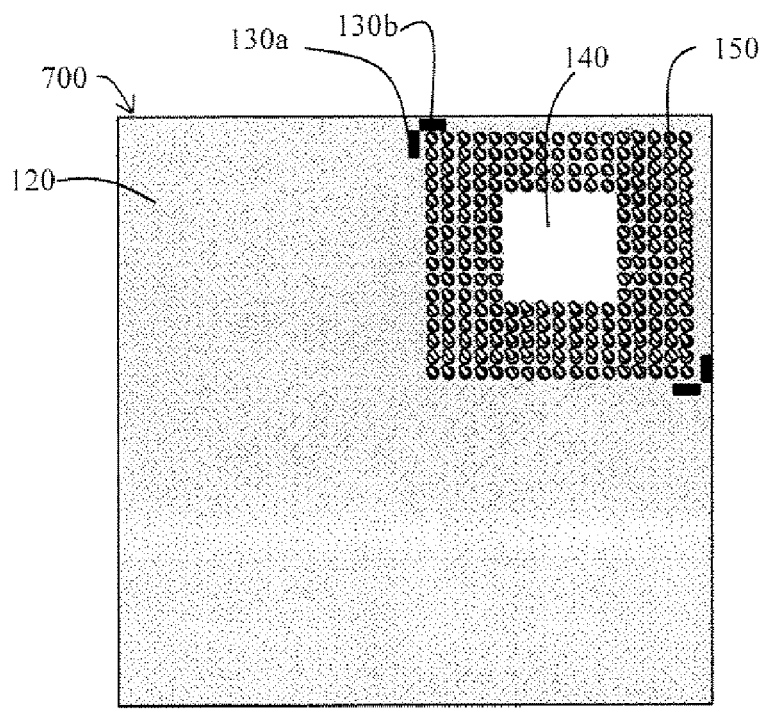
FIG. 7A illustrates the top view of a socket according to a fifth embodiment of the invention.

FIG. 7A illustrates the top view of a socket according to a fifth embodiment of the invention. In this embodiment, socket body 700 has planar surface 120 with no sidewall 110. Planar surface 120 has a surface area of at least the size of the smallest-sized substrate package socket body 700 may receive. In an embodiment, two pairs of socket locating features 130a, 130b are formed on planar surface 120. In an embodiment, each pair of socket locating features 130a, 130b are formed on planar surface 120 at locations corresponding to two diagonal corners of smallest-sized substrate package 200. When smallest-sized package 200 is placed within the perimeter defined by socket locating features 130a, 130b, lateral displacement of smallest-sized package 200 is prevented.

Figure 7B:
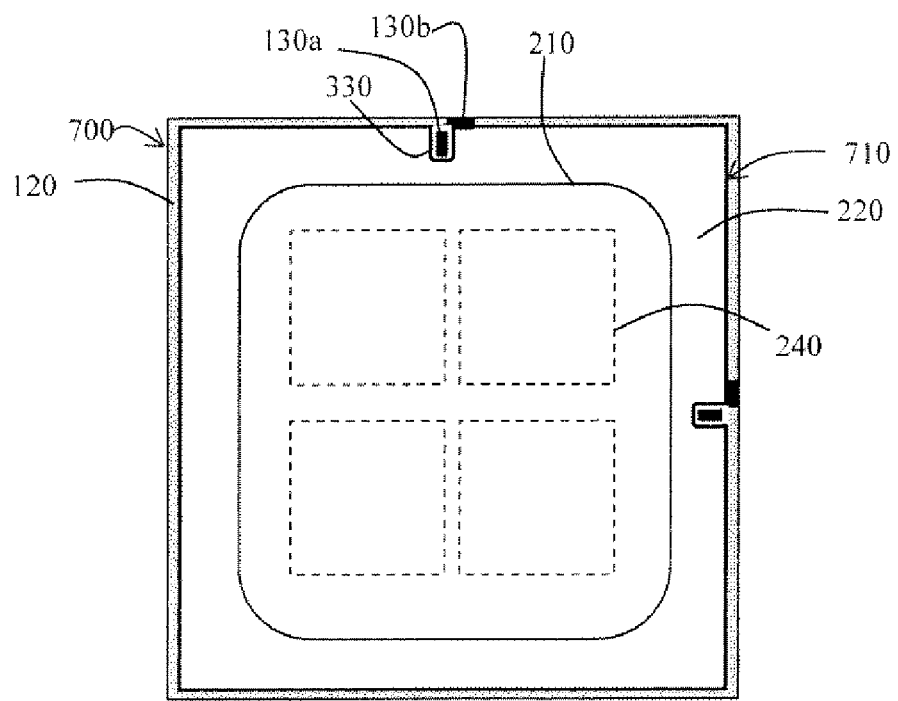
FIG. 7B illustrates the top view of an embodiment of a larger substrate package placed in a socket according to a fifth embodiment of the invention.

FIG. 7B illustrates the top view of an embodiment of larger substrate package 710 placed in a socket according to a fifth embodiment of the invention. In an embodiment, larger package 710 may have substrate body 220 larger than smallest-sized package 200 in both X and Y directions. In an embodiment, larger package 710 has two rectangular package locating features 330 formed on substrate body 220. Each of rectangular package locating features 330 meshes with the corresponding socket locating features 130a formed on socket body 700. The meshing between package locating features 330 and socket locating features 130a, 130b prevents lateral displacement of larger package 710.

Although the present invention is described herein with reference to specific embodiments, many modifications and variations therein will readily occur to those of ordinary skill in the art. Accordingly, all such variations and modifications are included within the intended scope of the embodiments of the present invention as defined by the following claims.

What is claimed is:

1. A socket, comprising:
    a socket body for receiving a first substrate package of a first size and a second substrate package of a second size, the second size being larger than the first size,
    a planar surface having an area of at least the first size;
    a plurality of socket contacts disposed on the planar surface, wherein the socket contacts connect with a plurality of contact pads formed on a bottom side of the first and the second substrate packages, the socket contacts and the contact pads having a common layout; and
    a plurality of socket locating features formed on the planar surface to prevent lateral displacement of the first substrate package, wherein the socket locating features mesh with a plurality of package locating features formed on the second substrate package.

2. The socket of claim 1, wherein the plurality of package locating features are larger in dimension than the plurality of socket locating features.

3. The socket of claim 1, wherein the plurality of socket locating features include a male coupling and the plurality of package locating features include a female coupling.

4. The socket of claim 3, wherein the male coupling includes a polygonal member and the female coupling includes a polygonal notch.

5. The socket of claim 4, wherein the polygonal member is rectangular and the polygonal notch is a rectangular notch with a portion unbounded.

6. The socket of claim 3, wherein the male coupling includes a round pin and the female coupling includes a round through hole.

7. The socket of claim 3, wherein the male coupling includes a pair of rectangular members arranged perpendicularly to each other and the female coupling includes a rectangular notch with a portion unbounded.

8. The socket of claim 1, wherein the first substrate package is a smallest substrate package the socket may receive and the plurality of socket locating features are formed corresponding to an edge of the smallest substrate package.

9. A method of forming a socket, comprising:
    forming a socket body for receiving a first substrate package of a first size and a second substrate package of a second size, the second size being larger than the first size,
    forming a planar surface having an area of at least the first size;
    disposing a plurality of socket contacts on the planar surface, wherein the socket contacts connect with a plurality of contact pads formed on a bottom side of the first and the second substrate packages, the socket contacts and the contact pads having a common layout; and
    forming a plurality of socket locating features on the planar surface to prevent lateral displacement of the first substrate package, wherein the plurality of socket locating features meshes with a plurality of package locating features formed on the second substrate package.

10. The method of claim 9, wherein the plurality of package locating features are larger in dimension than the plurality of socket locating features.

11. The method of claim 9, wherein the plurality of socket locating features includes a male coupling and the plurality of package locating features include a female coupling.

12. The method of claim 11, wherein the male coupling includes a polygonal member and the female coupling includes a polygonal notch.

13. The method of claim 12, wherein the polygonal member is rectangular and the polygonal notch is a rectangular notch with a portion unbounded.

14. The method of claim 11, wherein the male coupling includes a round pin and the female coupling includes a round through hole.

15. The method of claim 11, wherein the male coupling includes a pair of rectangular members arranged perpendicularly to each other and the female coupling includes a rectangular notch with a portion unbounded.

16. The method of claim 9, wherein the first substrate package is a smallest substrate package the socket may receive and the socket locating feature are formed corresponding to an edge of the smallest substrate package.

17. A socket, comprising:
    a socket body for receiving a first substrate package of a first size and a second substrate package of a second size, the second size being larger than the first size,
    a planar surface having an area of at least the first size;
    a plurality of socket contacts disposed on the planar surface, wherein the socket contacts connect with a plurality of contact pads formed on a bottom side of the first and the second substrate packages, the socket contacts and the contact pads having a common layout; and
    a plurality of socket locating features formed on the planar surface and configured to engage an edge of the first substrate package and to mesh with a plurality of corresponding package locating features formed on the second substrate package, the plurality of socket locating features prevent lateral displacement of the first and the second substrate packages.

* * * * *